(12) United States Patent
Kim et al.

(10) Patent No.: US 9,406,356 B2
(45) Date of Patent: Aug. 2, 2016

(54) LATCH CIRCUIT AND LATCH CIRCUIT ARRAY INCLUDING THE SAME

(71) Applicant: SK hynix Inc., Gyeonggi-do (KR)

(72) Inventors: Chang-Hyun Kim, Gyeonggi-do (KR); Hyun-Gyu Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/680,852

(22) Filed: Apr. 7, 2015

(65) Prior Publication Data

US 2016/0163360 A1    Jun. 9, 2016

(30) Foreign Application Priority Data

Dec. 8, 2014    (KR) .......................... 10-2014-0174711

(51) Int. Cl.
*G11C 7/10*    (2006.01)

(52) U.S. Cl.
CPC ....................... *G11C 7/10* (2013.01)

(58) Field of Classification Search
CPC .......... G11C 7/00; G11C 11/00; G11C 11/22; G11C 11/412; G11C 7/10; G11C 11/24; G11C 5/06; G11C 7/02; G11C 11/34; G11C 11/40; G11C 7/06; G11C 7/08; G11C 7/18; G11C 8/00; G11C 11/15; G11C 11/4091; G11C 15/00; G11C 15/04
USPC ............ 365/154, 205, 189.06, 207, 156, 145, 365/203, 149, 189.11, 230.06, 189.05, 226, 365/227, 189.15, 206, 63, 72, 181, 185.07, 365/188
See application file for complete search history.

(56) References Cited

U.S. PATENT DOCUMENTS 7,826,251 B2    11/2010    Chang et al.
2010/0084689 A1*    4/2010    Nakamura ............ H01L 27/092
257/206

OTHER PUBLICATIONS

Calin, T., et al., Upset hardened memory design for submicron CMOS technology, IEEE Transactions on Nuclear Science, 1996, pp. 2874-2878, vol. 43, No. 6.

* cited by examiner

*Primary Examiner* — Thong Q Le
(74) *Attorney, Agent, or Firm* — IP & T Group LLP

(57) ABSTRACT

A latch circuit may include first to fourth storage nodes; first to fourth transistor pairs, each including a PMOS transistor and an NMOS transistor connected in series through a corresponding one of the first to fourth storage nodes, wherein each of the first to fourth storage nodes is connected to a gate of an NMOS transistor of a transistor pair in a previous stage and a gate of a PMOS transistor of a transistor pair in a next stage; a first connection unit suitable for connecting a data bus with a $K^{th}$ storage node of the first to fourth storage nodes when read and write operations are performed, wherein K is an integer from 1 to 4; and second connection units suitable for connecting the data bus with one or more of the first to fourth storage nodes, except for the $K^{th}$ storage node, when the write operation is performed.

10 Claims, 4 Drawing Sheets

LATCH CIRCUIT AND LATCH CIRCUIT ARRAY INCLUDING THE SAME

CROSS-REFERENCE TO RELATED APPLICATION(S)

The present application claims priority of Korean Patent Application No. 10-2014-0174711, filed on Dec. 8, 2014, which is incorporated herein by reference in its entirety.

BACKGROUND

1. Field

Exemplary embodiments of the present invention relate to a latch circuit and a latch circuit array including the same.

2. Description of the Related Art

Latch circuits for storing data are one of the most widely used circuits in semiconductor devices. As the degree of integration of semiconductor devices increases, capacitance at the storage node of latch circuits is reduced. Therefore, there are more soft errors, when data stored in the storage node of the latch circuit changes unintentionally. Soft errors are a phenomenon in which data stored in the latch circuit changes due to cosmic rays, such as alpha particles.

Latch circuits that are resistant to soft errors have been suggested. The latch circuit that best represents this is a latch circuit called a dual interlocked storage cell (DICE), published in [Calin et al., "Upset Hardened Memory Design for Submicron CMOS Technology", IEEE Transactions on Nuclear Science, Vol. 43, No. 6 December 1996.].

FIG. 1 illustrates a configuration of the latch circuit published in the paper.

Referring to FIG. 1, the latch circuit includes first to fourth storage nodes SN1 to SN4, first to fourth transistor pairs 110, 120, 130, and 140, and a connection unit 150.

The first to fourth transistor pairs 110 to 140 include respective PMOS transistors 111 to 141 and NMOS transistors 112 to 142 that are connected in series through the respective storage nodes SN1 to SN4. Each of the storage nodes SN1 to SN4 is connected to a gate of an NMOS transistor of a transistor pair in a previous stage and a gate of a PMOS transistor of a transistor pair in a next stage. For example, the storage node SN2 is connected to the gate of the NMOS transistor 112 of the first transistor pair 110 in the previous stage and the gate of the PMOS transistor 131 of the third transistor pair 130 in the next stage.

The connection unit 150 includes four NMOS transistors 151 to 154. The NMOS transistors 151 to 154 are turned on when a selection signal SEL is activated, thus electrically connecting a data line D with the storage nodes SN2 and SN4 and electrically connecting an inverse data line DB with the storage nodes SN1 and SN3. The storage nodes SN2 and SN4 and the storage nodes SN1 and SN3 have opposite polarities.

The latch circuit of FIG. 1 has very strong immunity against soft errors generated due to cosmic rays. Data stored in the latch circuit may remain intact without an error unless data stored in two or more of the storage nodes SN1 to SN4 are changed due to cosmic rays. For example, although data stored in the storage node SN1 is changed from a logic high level 'H' to a logic low level 'L' due to a cosmic ray when data of logic levels 'H', 'L', 'H', and 'L' have been stored in the respective storage nodes SN1, SN2, SN3, and SN4, the data stored in the storage node SN1 may change from a logic low level 'L' to a logic high level 'H' again due to the PMOS transistor 111. That is, in the latch circuit of FIG. 1, soft errors are not generated unless the data stored in two or more storage nodes are changed due to cosmic rays since the probability that the data stored in two or more storage nodes will change is very low.

When the connection unit 150 connects the storage nodes SN1 to SN4 with the data lines D and DB, the latch circuit transfers data from the data lines D and DB to the storage nodes SN1 to SN4 during a write operation, and transfers data from the storage nodes SN1 to SN4 to the data lines D and DB during a read operation. That is, when the data lines D and DB have strong a driving force, a write operation is performed on the latch circuit. When the data lines D and DB have a weak driving force, a read operation is performed on the latch circuit. However, even in the read operation, data stored in the latch circuit may be lost because data stored in the storage nodes SN1 to SN4 are inverted due to charges remaining the data lines D and DB.

SUMMARY

Various embodiments are directed to a latch circuit and a latch circuit array including the same that are capable of preventing stored data from being lost when a read operation is performed.

In an embodiment, a latch circuit may include first to fourth storage nodes; first to fourth transistor pairs, each suitable for including a PMOS transistor and an NMOS transistor connected in series through a corresponding one of the first to fourth storage nodes, wherein each of the first to fourth storage nodes is connected to a gate of an NMOS transistor of a transistor pair in a previous stage and a gate of a PMOS transistor of a transistor pair in a next stage; a first connection unit suitable for electrically connecting a data bus with a $K^{th}$ storage node of the first to fourth storage nodes when read and write operations are performed, wherein K is an integer from 1 to 4, inclusive; and one or more second connection units suitable for electrically connecting the data bus with one or more of the first to fourth storage nodes, except for the $K^{th}$ storage node, when the write operation is performed.

The data bus may include a first data line and a second data line suitable for transmitting data having a phase opposite to the phase of the first data line.

The first connection unit may electrically connect the first data line with the $K^{th}$ storage node when the read and write operations are performed. The second connection units may connect the first data line with one of the first to fourth storage nodes except for the $K^{th}$ storage node and connect the second data line with the remaining two storage nodes of the first to fourth storage nodes when the write operation is performed.

In an embodiment, a latch circuit array may include a data bus; a control circuit suitable for activating one of first to $N^{th}$ read/write signals and one of first to $N^{th}$ write signals when a write operation is performed and activating one of the first to $N^{th}$ read/write signals when a read operation is performed; and first to $N^{th}$ latch circuits each suitable for including first to fourth storage nodes, receiving a corresponding one of the first to $N^{th}$ write signals and a corresponding one of the first to $N^{th}$ read/write signals, electrically connecting the data bus with one of the first to fourth storage nodes when the corresponding read/write signal is activated, and electrically connecting the data bus with one or more of the first to fourth storage nodes except for the connected storage node when the corresponding write signal is activated.

Each of the first to $N^{th}$ latch circuits may include the first to fourth storage nodes; first to fourth transistor pairs, each suitable for including a PMOS transistor and an NMOS transistor connected in series through a corresponding one of the first to fourth storage nodes, wherein each of the first to fourth storage nodes is connected to a gate of an NMOS transistor of a transistor pair in a previous stage and a gate of a PMOS transistor of a transistor pair in a next stage; a first connection unit suitable for electrically connecting the data bus with a K$^{th}$ storage node of the first to fourth storage nodes when the corresponding read/write signal is activated, wherein K is an integer from 1 to 4, inclusive; and one or more second connection units suitable for electrically connecting the data bus with the one or more of the first to fourth storage nodes except for the K$^{th}$ storage node when the corresponding write signal is activated.

In an embodiment, a latch circuit may include a plurality of storage nodes; a plurality of transistor pairs, each comprising a PMOS transistor and an NMOS transistor connected in series through a corresponding one of the plurality of storage nodes, wherein each storage node is connected to a gate of an NMOS transistor of a transistor pair in a previous stage and a gate of a PMOS transistor of a transistor pair in a next stage; a first connection unit suitable for electrically connecting a data bus with one of the storage nodes when read and write operations are performed; and a plurality of second connection units suitable for electrically connecting the data bus with the remaining storage nodes when the write operation is performed.

DETAILED DESCRIPTION

Figure 1:
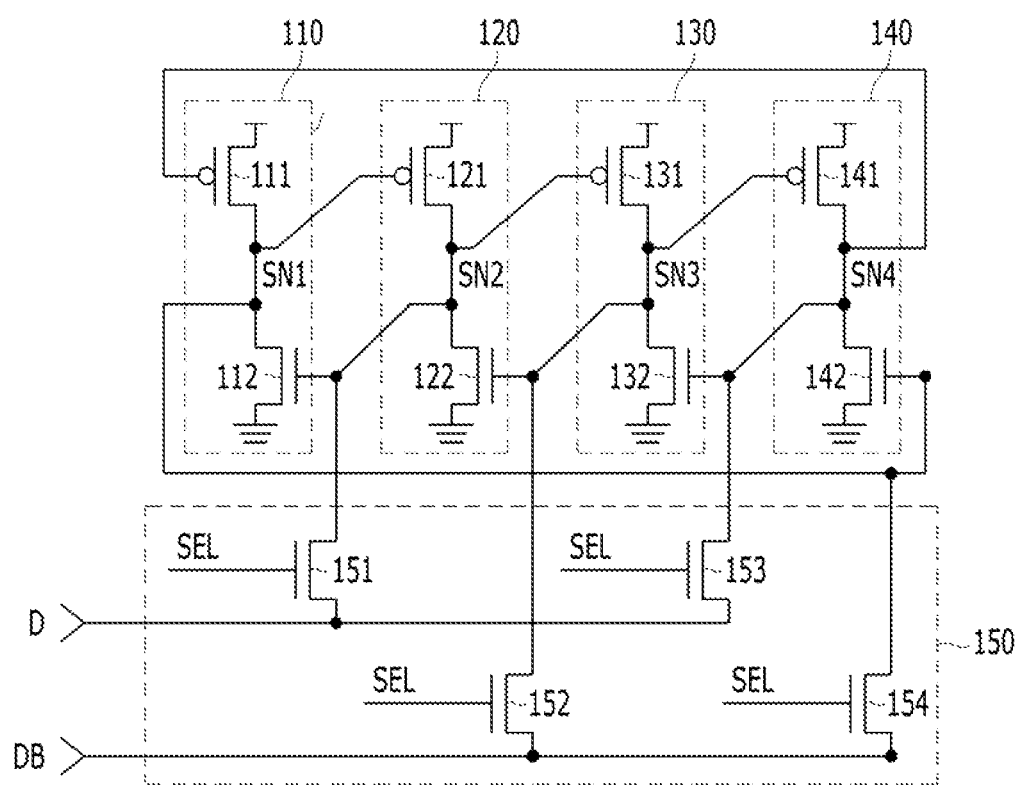
FIG. 1 illustrates a configuration of a known latch circuit.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
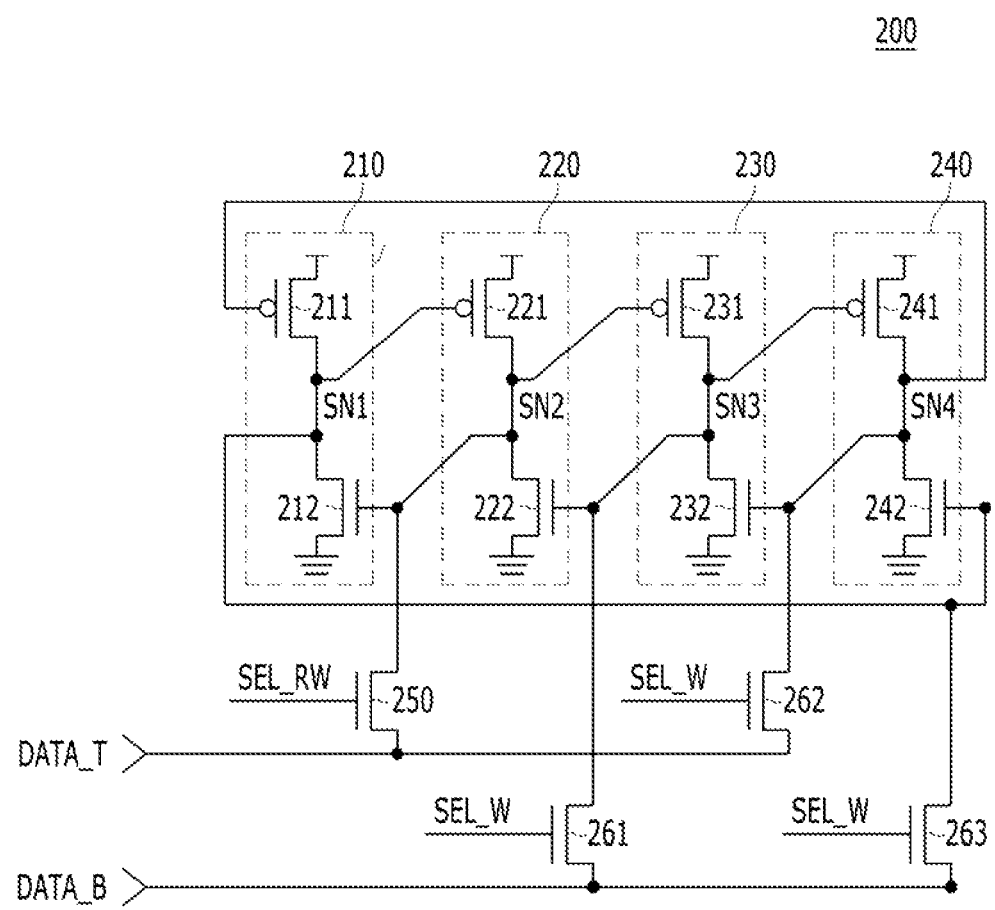
FIG. 2 illustrates a configuration of a latch circuit in accordance with an embodiment of the present invention.

FIG. 2 illustrates a configuration of a latch circuit 200 in accordance with an embodiment of the present invention.

Referring to FIG. 2, the latch circuit 200 may include first to fourth storage nodes SN1 to SN4, first to fourth transistor pairs 210 to 240, a first connection unit 250, and second connection units 261 to 263. Data buses DATA_T and DATA_B are buses on which data to be written in the latch circuit 200 and data to be read from the latch circuit 200 are transferred, and may include a first data line DATA_T and a second data line DATA_B having opposite polarities.

The first to fourth transistor pairs 210 to 240 may include respective PMOS transistors 211 to 241 and respective NMOS transistors 221 to 242 that are connected in series through the respective storage nodes SN1 to SN4. Each of the first to fourth storage nodes SN1 to SN4 may be connected to a gate of an NMOS transistor of a transistor pair in a previous stage and a gate of a PMOS transistor of a transistor pair in a next stage. For example, the second storage node SN2 may be connected to the gate of the NMOS transistor 212 of the first transistor pair 210 in the previous stage and the gate of the PMOS transistor 231 of the third transistor pair 230 in the next stage. A transistor pair placed in the previous stage of the first storage node SN1 may be the fourth transistor pair 240, and a transistor pair placed in the next stage of the fourth storage node SN4 may be the first transistor pair 210.

The first connection unit 250 may electrically connect the second storage node SN2 with one of the data buses DATA_T and DATA_B when read and write operations are performed on the latch circuit 200. The read operation may mean an operation for transferring data from the latch circuit 200 to the data buses DATA_T and DATA_B, and the write operation may mean an operation for transferring data from the data buses DATA_T and DATA_B to the latch circuit 200. Though FIG. 2 has illustrated that the first connection unit 250 electrically connects the second storage node SN2 with the first data line DATA_B of the data buses DATA_T and DATA_B, the first connection unit 250 may connect any one of the first to fourth storage nodes SN1 to SN4 with any one of the first data line DATA_T and the second data line DATA_B of the data buses DATA_T and DATA_B. The first connection unit 250 may be an NMOS transistor. A read/write signal SEL_RW that controls the first connection unit 250 may be activated when the read and write operations are performed on the latch circuit 200.

The second connection units 261 to 263 may electrically connect the first, third, and fourth storage nodes SN1, SN3, and SN4 with the data buses DATA_T and DATA_B when the write operation is performed on the latch circuit 200. The second connection units 261 to 263 are different from the first connection unit 250 in that they are activated only in the write operation, but are not activated in the read operation. FIG. 2 has illustrated that the number of second connection units 261 to 263 is three and the first, third, and fourth storage nodes SN1, SN3, and SN4 and the data buses DATA_T and DATA_B are electrically connected. In some embodiments, the number of second connection units may be one or more, and one or more of the remaining three nodes, e.g., SN1, SN3, and SN4, except for a storage node, e.g., SN2, corresponding to the first connection unit 250 may be connected to the data buses DATA_T and DATA_B. Each of the second connection units 261 to 263 may be an NMOS transistor. A write signal SEL_W that controls the second connection units 261 to 263 may be activated when the write operation is performed on the latch circuit 200.

Figure 3:
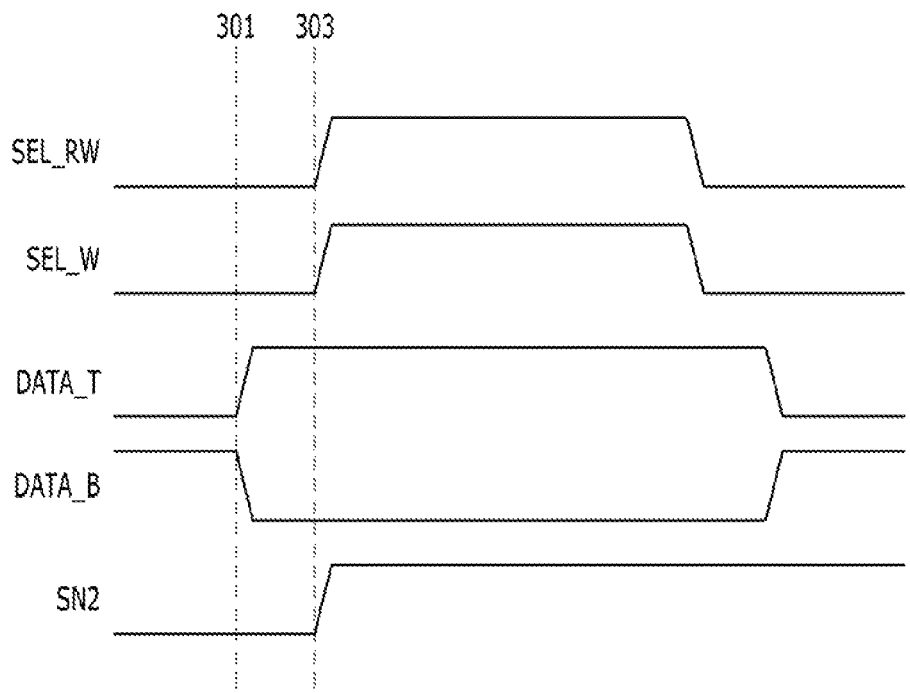
FIG. 3 is a timing diagram Illustrating a write operation of the latch circuit of FIG. 2.
Figure 4:
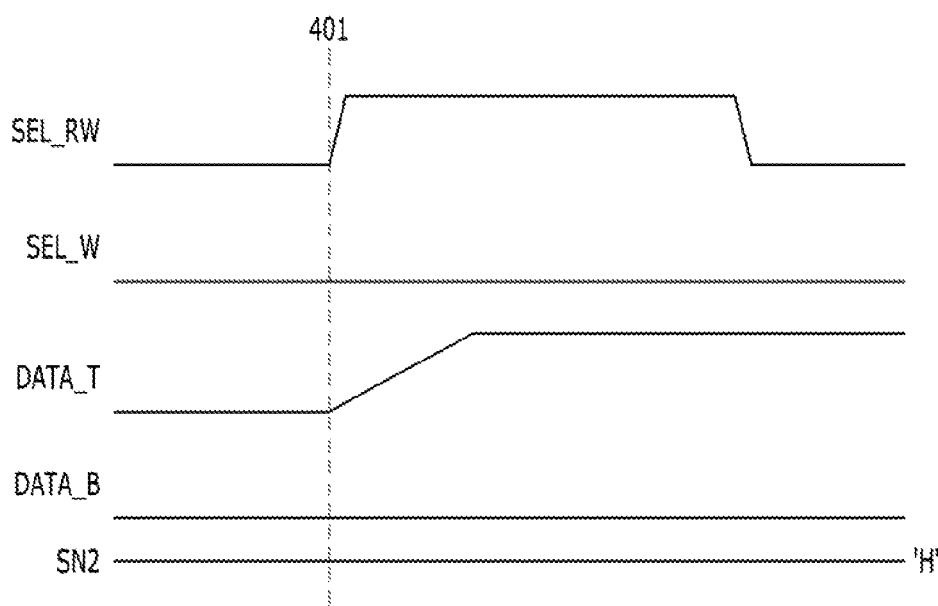
FIG. 4 is a timing diagram illustrating a read operation of the latch circuit of FIG. 2.

FIG. 3 is a timing diagram illustrating the write operation of the latch circuit 200 of FIG. 2, and FIG. 4 is a timing diagram illustrating the read operation of the latch circuit 200 of FIG. 2.

Referring to FIG. 3, prior to the write operation, data to be written in the latch circuit 200 may be loaded onto the data buses DATA_T and DATA_B at a point of time "301." In the write operation, the data buses DATA_T and DATA_B may be driven relatively strongly. In this case, the first data line DATA_T has been Illustrated as being driven to a logic high level, and the second data line DATA_B has been illustrated as being in a logic low level.

At a point of time "303" at which the write operation is started, both the read/write signal SEL_RW and the write signal SEL_W may be activated. Accordingly, the data buses DATA_T and DATA_B and the first to fourth storage nodes SN1 to SN4 may be electrically connected by the first connection unit 250 and the second connection units 261 to 263, and the data of the data buses DATA_T and DATA_B may be written in the first to fourth storage nodes SN1 to SN4. FIG. 3 illustrates that data of a logic high level is written to the second storage node SN2 when data of a logic low level has been stored in the second storage node SN2, during the write operation.

Referring to FIG. 4, prior to the read operation, it is assumed that data of a logic high level has been stored in the second storage node SN2. Furthermore, the first data line DATA_T of the data buses DATA_T and DATA_B may have been precharged to a logic low level, and the second data line DATA_B thereof may have been precharged to a logic high level. In the read operation, the data buses DATA_T and DATA_B may have been precharged weakly.

At a point of time "401" at which the read operation is started, the read/write signal SEL_RW is activated and thus the first connection unit 250 is activated in response to the read/write signal SEL_RW. Accordingly, the first data line DATA_T of the data buses DATA_T and DATA_B and the second storage node SN2 may be electrically connected by the first connection unit 250, and the data of a logic high level of the second storage node SN2 may be read into the first data line DATA_T.

In the latch circuit 200 of FIG. 2, the data stored therein is not changed unless logic levels of data stored in two or more of the first to fourth storage nodes SN1 to SN4 change at the same time. The data stored in the latch circuit 200 are not lost when the read operation is performed because only the second storage node SN2 of the first to fourth storage nodes SN1 to SN4 is connected to the first data line DATA_T of the data buses DATA_T and DATA_B in the read operation. The logic value of the data stored in the second storage node SN2 continues to remain intact by the PMOS transistor 221 or the NMOS transistor 222 no matter how strong charges that remain in the first data line DATA_T may be when the read operation is performed. As a result, the data stored in the second storage node SN2 may be reliably transferred to the first data line DATA_T.

Figure 5:
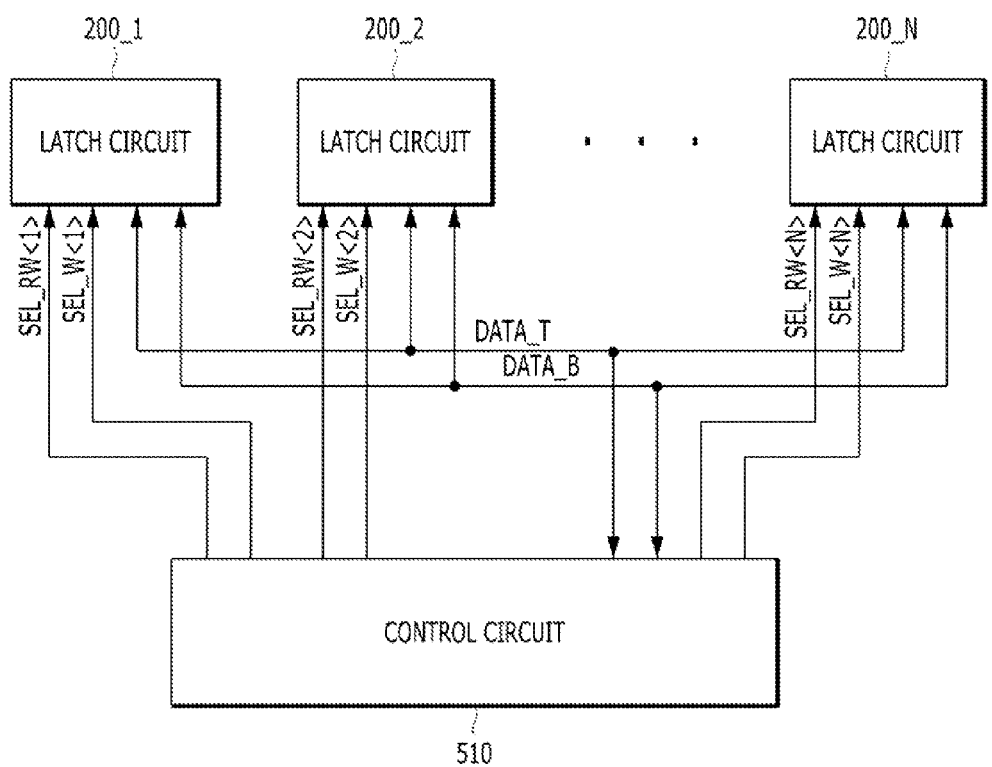
FIG. 5 illustrates a configuration of a latch circuit array in accordance with an embodiment of the present invention.

FIG. 5 illustrates a configuration of a latch circuit array in accordance with an embodiment of the present invention. An example in which the number of the latch circuits 200 in FIG. 2 is set to N is described with reference to FIG. 5.

Referring to FIG. 5, the latch circuit array may include data buses DATA_T and DATA_B, a control circuit 510, and first to Nm latch circuits 200_1 to 200_N.

The control circuit 510 may write data in the latch circuits 200_1 to 200_N and read data stored in the latch circuits 200_1 to 200_N. The control circuit 510 may generate first to $N^{th}$ read/write signals SEL_RW<1> to SEL_RW<N> and first to $N^{th}$ write signals SEL_W<1> to SEL_W<N>. Since the latch circuits 200_1 to 200_N share the data buses DATA_T and DATA_B, write and read operations may be performed on the latch circuits 200_1 to 200_N one at a time.

When the write operation is performed, the control circuit 510 may activate a read/write signal and a write signal corresponding to a latch circuit that belongs to the latch circuits 200_1 to 200_N and on which the write operation is to be performed, and may drive write data to the data buses DATA_T and DATA_B. For example, when the write operation is performed on the third latch circuit 200_3, the control circuit 510 may activate the third read/write signal SELRW<3> and the third write signal SEL_W<3> and drive data to be written in the third latch circuit 200_3 to the data buses DATA_T and DATA_B.

When the read operation is performed, the control circuit 510 may activate a read/write signal corresponding to a latch circuit that belongs to the latch circuits 200_1 to 200_N and on which the read operation is to be performed, and may receive read data based on a logic level of the first data line DATA_T of the data buses DATA_T and DATA_B. For example, when the read operation is performed on the second latch circuit 200_2, the control circuit 510 may activate the second read/write signal SEL_RW<2> and read data stored in the second latch circuit 200_2 based on the logic level of the first data line DATA_T.

The latch circuits 200_1 to 200_N may have the same configuration as the latch circuit 200 of FIG. 2. The latch circuits 200_1 to 200_N share the data buses DATA_T and DATA_B, but the read/write signals SEL_RW<1> to SEL_RW<N> and the write signals SEL_W<1> to SEL_W<N> may be separately assigned to the latch circuits 200_1 to 200_N.

In accordance with the embodiments of the present invention, a phenomenon in which data stored in the latch circuit is lost when a read operation is performed can be prevented.

Although various embodiments have been described for illustrative purposes, it will be apparent to those skilled in the art that various changes and modifications may be made without departing from the spirit and scope of the invention as defined in the following claims.

What is claimed is:

1. A latch circuit comprising:
   first to fourth storage nodes;
   first to fourth transistor pairs, each comprising a PMOS transistor and an NMOS transistor connected in series through a corresponding one of the first to fourth storage nodes, wherein each of the first to fourth storage nodes is connected to a gate of an NMOS transistor of a transistor pair in a previous stage and a gate of a PMOS transistor of a transistor pair in a next stage;
   a first connection unit suitable for electrically connecting a data bus with a $K^{th}$ storage node of the first to fourth storage nodes when read and write operations are performed, wherein K is an integer from 1 to 4, inclusive; and
   one or more second connection units suitable for electrically connecting the data bus with one or more of the first to fourth storage nodes, except for the $K^{th}$ storage node, when the write operation is performed, and electrically disconnecting the data bus with one or more of the first to fourth storage nodes, except for the $K^{th}$ storage node, when the read operation is performed.

2. The latch circuit of claim 1, wherein the data bus comprises:
   a first data line; and
   a second data line suitable for transmitting data having a phase that is opposite to a phase of the first data line.

3. The latch circuit of claim 2, wherein:
   the first connection unit electrically connects the first data line with the $K^{th}$ storage node when the read and write operations are performed, and
   the second connection units connect the first data line with one of the first to fourth storage nodes, except for the $K^{th}$ storage node, and connect the second data line with the remaining two storage nodes of the first to fourth storage nodes when the write operation is performed.

4. The latch circuit of claim 1, wherein each of the first connection unit and the one or more second connection units comprises an NMOS transistor.

5. A latch circuit array comprising:
   a data bus;
   a control circuit suitable for activating one of first to $N^{th}$ read/write signals and one of first to $N^{th}$ write signals when a write operation is performed, and activating one of the first to $N^{th}$ read/write signals with deactivating the first to $N^{th}$ write signals, when a read operation is performed; and first to $N^{th}$ latch circuits, each comprising first to fourth storage nodes, and suitable for receiving a corresponding one of the first to $N^{th}$ write signals and a corresponding one of the first to $N^{th}$ read/write signals, electrically connecting the data bus with one of the first to fourth storage nodes when the corresponding read/write signal is activated, and electrically connecting the data bus with one or more of the first to fourth storage nodes except for the connected storage node when the corresponding write signal is activated.

6. The latch circuit array of claim 5, wherein each of the first to $N^{th}$ latch circuits comprises:
the first to fourth storage nodes;
first to fourth transistor pairs, each comprising a PMOS transistor and an NMOS transistor connected in series through a corresponding one of the first to fourth storage nodes, wherein each of the first to fourth storage nodes is connected to a gate of an NMOS transistor of a transistor pair in a previous stage and a gate of a PMOS transistor of a transistor pair in a next stage;
a first connection unit suitable for electrically connecting the data bus with a $K^{th}$ storage node of the first to fourth storage nodes when the corresponding read/write signal is activated, wherein K is an integer from 1 to 4, inclusive; and
one or more second connection units suitable for electrically connecting the data bus with the one or more of the first to fourth storage nodes, except for the $K^{th}$ storage node, when the corresponding write signal is activated.

7. The latch circuit array of claim 6, wherein the data bus comprises:
a first data line; and
a second data line suitable for transmitting data having a phase opposite to a phase of the first data line.

8. The latch circuit array of claim 7, wherein:
the first connection unit electrically connects the first data line with the $K^{th}$ storage node when the corresponding read/write signal is activated; and
the second connection units electrically connect the first data line with one of the first to fourth storage nodes, except for the $K^{th}$ storage node, and electrically connect the second data line with the remaining two storage nodes of the first to fourth storage nodes when the corresponding write signal is activated.

9. The latch circuit array of claim 6, wherein each of the first connection unit and the one or more second connection units comprises an NMOS transistor.

10. A latch circuit comprising:
a plurality of storage nodes;
a plurality of transistor pairs, each comprising a PMOS transistor and an NMOS transistor connected in series through a corresponding one of the plurality of storage nodes, wherein each storage node is connected to a gate of an NMOS transistor of a transistor pair in a previous stage and a gate of a PMOS transistor of a transistor pair in a next stage;
a first connection unit suitable for electrically connecting a data bus with one of the storage nodes when read and write operations are performed; and
a plurality of second connection units suitable for electrically connecting the data bus with one or more of the remaining storage nodes when the write operation is performed, and electrically disconnecting the data bus with one or more of the remaining storage nodes when the read operation is performed.

\* \* \* \* \*